(12) United States Patent
Vu et al.

(10) Patent No.: US 6,586,822 B1
(45) Date of Patent: Jul. 1, 2003

(54) INTEGRATED CORE MICROELECTRONIC PACKAGE

(75) Inventors: Quat T. Vu, Santa Clara, CA (US); Jian Li, Sunnyvale, CA (US); Qing Ma, San Jose, CA (US); Maria V. Henao, Pleasanton, CA (US); Xiao-Chun Mu, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/658,819

(22) Filed: Sep. 8, 2000

(51) Int. Cl.$^7$ ................................. H01L 23/02
(52) U.S. Cl. ............... 257/678; 438/100; 438/106; 438/108; 438/109; 438/113; 438/127; 174/524
(58) Field of Search ............... 438/100, 106, 438/108, 109, 113, 127; 174/524

(56) References Cited

U.S. PATENT DOCUMENTS

| | | | |
|---|---|---|---|
| 5,353,498 A | 10/1994 | Fillion et al. | |
| 5,422,513 A | 6/1995 | Marcinkiewicz et al. | |
| 5,497,033 A | 3/1996 | Fillion et al. | |
| 5,527,741 A | 6/1996 | Cole et al. | |
| 5,703,400 A | 12/1997 | Wojnarowski et al. | |
| 5,745,984 A | 5/1998 | Cole, Jr. et al. | |
| 6,117,704 A | * | 9/2000 | Yamaguchi et al. ........ 438/100 |
| 6,271,469 B1 | * | 8/2001 | Ma et al. .................... 174/52.4 |
| 6,368,894 B1 | * | 4/2002 | Shen ........................... 438/106 |

FOREIGN PATENT DOCUMENTS

| JP | 11045955 | 2/1999 |
|---|---|---|
| JP | 11312868 | 11/1999 |

* cited by examiner

*Primary Examiner*—David Nelms
*Assistant Examiner*—Mai-Huong Tran
(74) *Attorney, Agent, or Firm*—Schwegman, Lundberg, Woessner & Kluth, P.A.

(57) ABSTRACT

A microelectronic package including a microelectronic die disposed within an opening in a microelectronic packaging core, wherein an encapsulation material is disposed within portions of the opening not occupied by the microelectronic die. Build-up layers of dielectric materials and conductive traces are then fabricated on the microelectronic die, the encapsulant material, and the microelectronic package core to form the microelectronic package.

19 Claims, 8 Drawing Sheets

INTEGRATED CORE MICROELECTRONIC PACKAGE

BACKGROUND OF THE INVENTION

1. Field of the Invention

The present invention relates to apparatus and processes for packaging microelectronic dice. In particular, the present invention relates to a packaging technology that encapsulates a microelectronic die within a microelectronic package core.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 20, true CSP involves fabricating build-up layers directly on an active surface 204 of a microelectronic die 202. The build-up layers may include a dielectric layer 206 disposed on the active surface 204. Conductive traces 208 may be formed on the dielectric layer 206, wherein a portion of each conductive trace 208 contacts at least one contact 212 on the active surface 204. External contacts, such as solder balls or conductive pins for contact with an external component (not shown), may be fabricated to electrically contact at least one conductive trace 208. FIG. 20 illustrates the external contacts as solder balls 214 which are surrounded by a solder mask material 216 on the dielectric layer 206. However, in such true CSP, the surface area provided by the microelectronic die active surface 204 generally does not provide enough surface for all of the external contacts needed to contact the external component (not shown) for certain types of microelectronic dice (e.g., logic).

Additional surface area can be provided with the use of an interposer, such as a substrate (substantially rigid material) or a flex component (substantially flexible material). FIG. 21 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 are formed on the bond pads 236 (shown as solder balls). The external contacts 244 are utilized to achieve electrical communication between the microelectronic die 224 and an external electrical system (not shown).

The use of the substrate interposer 222 requires number of processing steps, which increases the cost of the package. Additionally, the use of the small solder balls 228 presents crowding problems which can result in shorting between the small solder balls 228 and can present difficulties in inserting underfill material between the microelectronic die 224 and the substrate interposer 222 to prevent contamination and to increase mechanical reliability. Furthermore, necessity of having two sets of solder balls (i.e., small solder balls 228 and external contacts 244) to achieve connection between the microelectronic die 224 and the external electrical system decreases the overall performance of the microelectronic die package.

Therefore, it would be advantageous to develop new apparatus and techniques to provide additional surface area to form traces for use in CSP applications and eliminate the necessity of the substrate interposer.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1–19 illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

The present invention includes a packaging technology that places at least one microelectronic die within at least one opening in a microelectronic package core and secures the microelectronic die/dice within the opening(s) with an encapsulation material. Build-up layers of dielectric materials and conductive traces are then fabricated on the microelectronic die, the encapsulant material, and the microelectronic package core to form a microelectronic package.

The technical advantage of this invention is that the present invention enables the microelectronic package to be built around the microelectronic die. This provides sufficient surface area to position external contacts, while eliminating the need for a substrate interposer, as discussed above. The elimination of the substrate interposer increases the performance of the microelectronic package by eliminating one set of solder connections. Furthermore, the elimination of the substrate interposer increases power delivery performance by bringing the circuitry within the microelectronic die closer to power delivery components (such as decoupling capacitors and the like) of the external electrical system to which the microelectronic package is attached.

Figure 1:
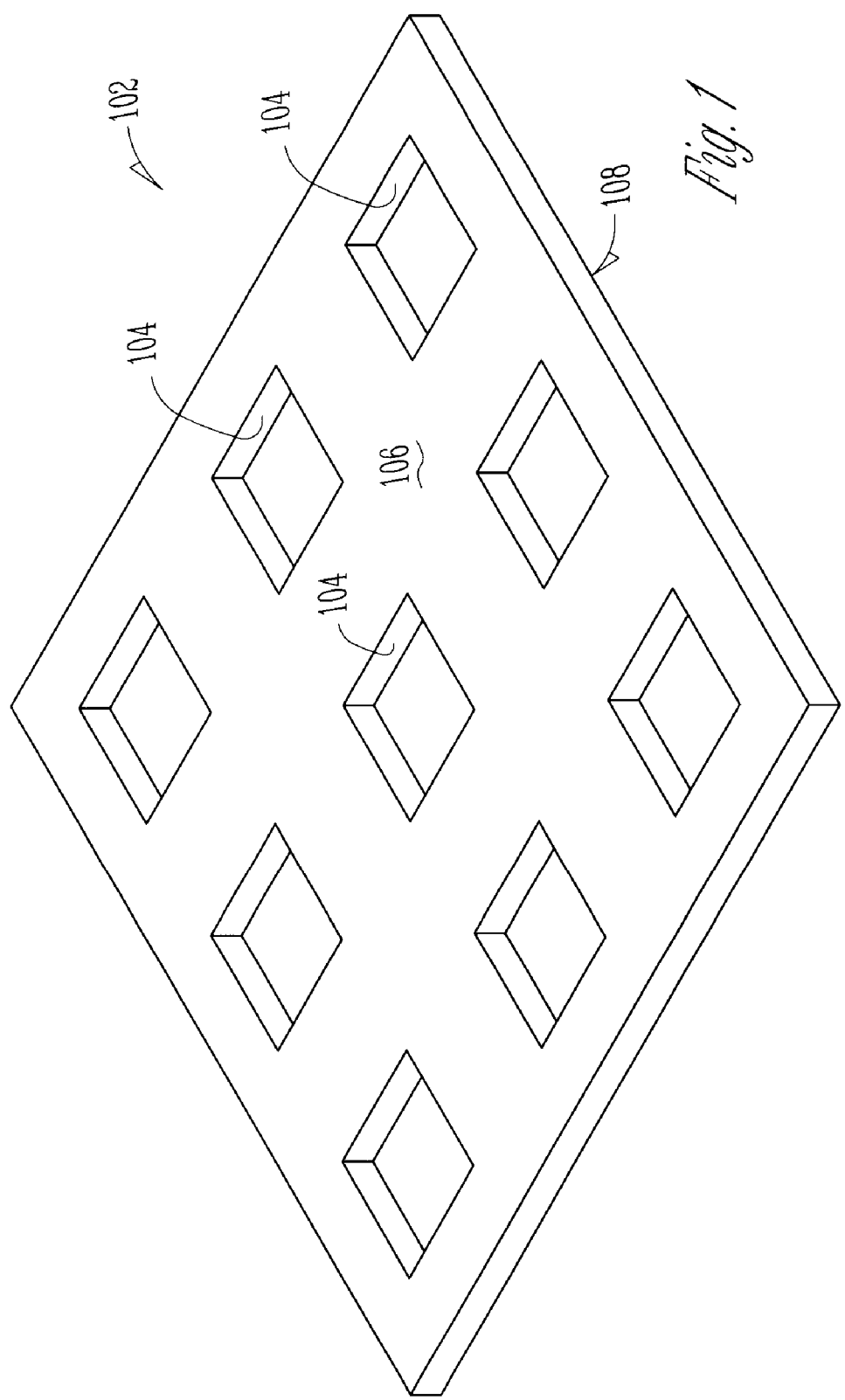
FIG. 1 is an oblique view of a microelectronic package core, according to the present invention.
Figure 2:
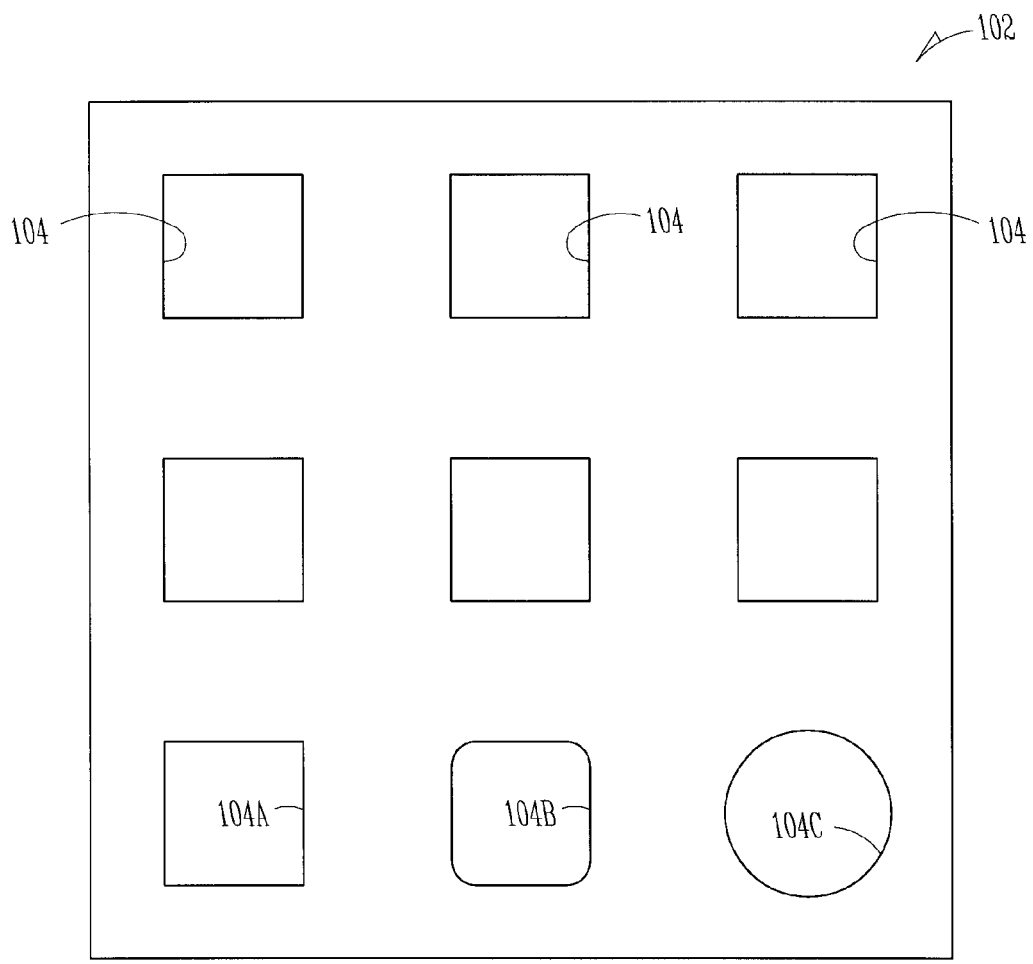
FIG. 2 is a top plan via of a microelectronic package core having examples of alternate microelectronic package core openings, according to the present invention.

FIG. 1 illustrates a microelectronic package core 102 used to fabricate a microelectronic package. The microelectronic package core 102 preferably comprises a substantially planar material. The material used to fabricate the microelectronic package core 102 may include, but is not limited to, a Bismaleimide Triazine ("BT") resin based material, an FR4 material (a flame retarding glass/epoxy material), various polyimide materials, ceramic material, and the like, and metallic materials (such as copper) and the like. The microelectronic package core 102 has at least one opening 104 extending therethrough from a first surface 106 of the microelectronic package core 102 to an opposing second surface 108 of the microelectronic package core 102. As shown in FIG. 2, the opening(s) 104 may be of any shape and size including, but not limited to, rectangular/square 104a, rectangular/square with rounded corners 104b, and circular 104c. The only limitation on the size and shape of the opening(s) 104 is that they must be appropriately sized and shaped to house a corresponding microelectronic die therein, as will be discussed below.

Figure 3:
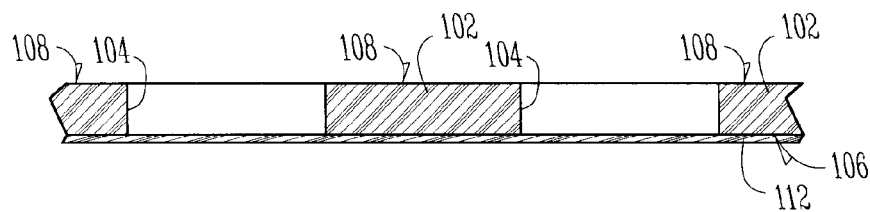
FIG. 3 is a side cross-sectional view of a microelectronic package core abutted to a protective film, according to the present invention.
Figure 4:
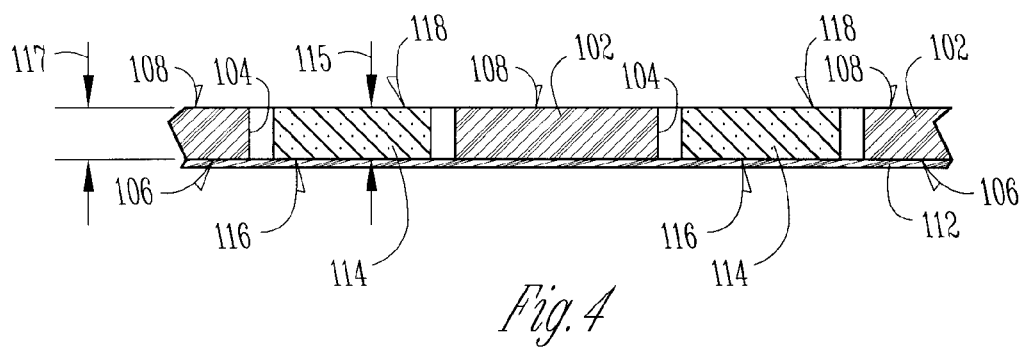
FIG. 4 is a side cross-sectional view of microelectronic dice disposed within openings of the microelectronic package core, which also abut the protective film, according to the present invention.

FIG. 3 illustrates the microelectronic package core first surface 106 abutting a protective film 112. The protective film 112 is preferably a substantially flexible material, such as Kapton® polyimide film (E. I. du Pont de Nemours and Company, Wilmington, Del.), but may be made of any appropriate material, including metallic films. FIG. 4 illustrates microelectronic dice 114, each having an active surface 116 and a back surface 118, placed in corresponding openings 104 of the microelectronic package core 102. In a preferred embodiment (illustrated), the thickness 117 of the microelectronic package core 102 and the thickness 115 of the microelectronic dice 114 are substantially equal. The microelectronic dice 114 are each placed such that their active surfaces 116 abut the protective film 112. The protective film 112 may have an adhesive, such as silicone, which attaches to the microelectronic package core first surface 106 and the microelectronic die active surface 116. This adhesive-type film may be applied prior to placing the microelectronic die 114 and microelectronic package core 102 in a mold or other piece of equipment used for the encapsulation process. The protective film 112 may also be a non-adhesive film, such as a ETFE (ethylene-tetrafluoroethylene) or Teflon® film, which is held on the microelectronic die active surface 116 and the microelectronic package core first surface 106 by an inner surface of the mold or other piece of equipment during the encapsulation process.

Figure 5:
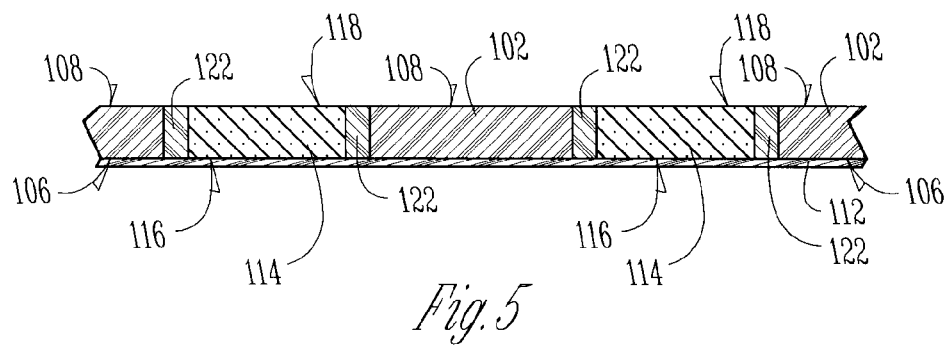
FIG. 5 is a side cross-sectional view of the assembly of FIG. 4 after encapsulation, according to the present invention.
Figure 6:
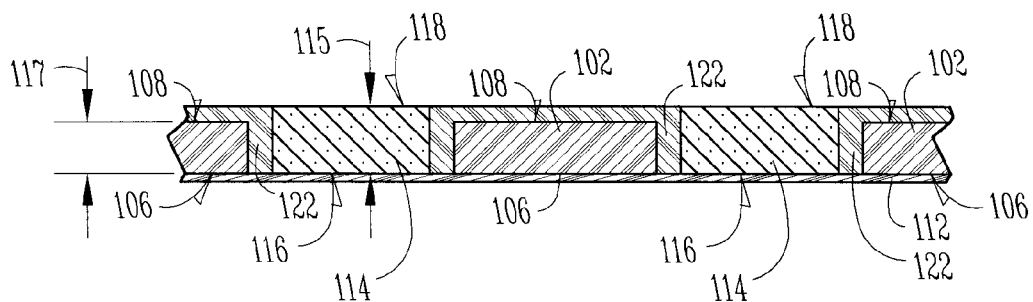
FIG. 6 is a side cross-sectional view of the assembly having microelectronic dice which are thicker than the microelectronic package core after encapsulation, according to the present invention.

The microelectronic die 114 is then encapsulated with an encapsulation material 122, such as plastics, resins, epoxies, and the like. As shown in FIG. 5, the encapsulation material is disposed in portions of the opening(s) 104 not occupied by the microelectronic die 114. In FIG. 6, an alternate embodiment is shown wherein the microelectronic die thickness 115 is greater than the microelectronic package core thickness 117. Thus, the encapsulation material covers the microelectronic package core second surface 108 and portions of the opening(s) 104 not occupied by the microelectronic die 114, as shown in FIG. 6.

The encapsulation of the microelectronic die 114 may be achieved by any known process, including but not limited to transfer and compression molding, and dispensing. The encapsulation material 122 secures the microelectronic die 114 within the microelectronic package core 102 and provides mechanical rigidity for the resulting structure and provides surface area for the subsequent build-up of trace layers.

Figure 7:
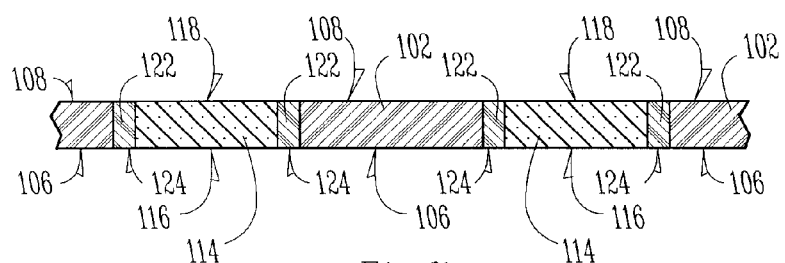
FIG. 7 is a side cross-sectional view of the assembly of FIG. 5 after the protective film has been removed, according to the present invention.

After encapsulation, the protective film 112 is removed, as shown in FIG. 7, to expose the microelectronic die active surface 116. As also shown in FIG. 7, the encapsulation material 122 is preferably molded to be a filler for the space between the microelectronic package core first surface 106 and the microelectronic die active surface 116. This results in at least one surface 124 that is substantially planar to the microelectronic die active surface 116 and the microelectronic package core first surface 106. The encapsulation material surface 124 may be utilized in further fabrication steps, along with the microelectronic package core first surface 106, as additional surface area for the formation of build-up layers, such as dielectric material layers and conductive traces.

Figure 8:
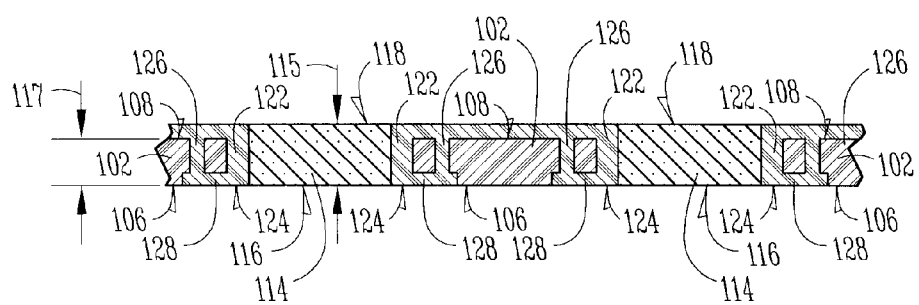
FIG. 8 is a side cross-sectional view of an alternate microelectronic package core within a microelectronic assembly, according to the present invention.

As shown in FIG. 8, the microelectronic package core 102 may include a plurality of vias 126 extending therethrough and/or a plurality of undercuts or channels 128 in microelectronic package core first surface 106. The embodiment shown in FIG. 8 shows the microelectronic die thickness 115 greater than the microelectronic package core thickness 117, such as shown in FIG. 6, but is not so limited. Such structures may be used to allow the encapsulation material 122 to flow therein, which will result in a more secure adherence of the encapsulation material 122 to the microelectronic package core 102.

In reference to FIGS. 7 and 8, it is noted that the encapsulation material 122 does not cover the microelectronic die back surface 118. The uncovered microelectronic back surface 118 allows for a heat sink to be directly attached thereto after each microelectronic die 114 has been singulated, as will be discussed below.

Although the following description relates to a bumpless, built-up layer technique for the formation of build-up layers, the method of fabrication is not so limited. The build-up layers may be fabricated by a variety of techniques known in the art.

Figure 9:
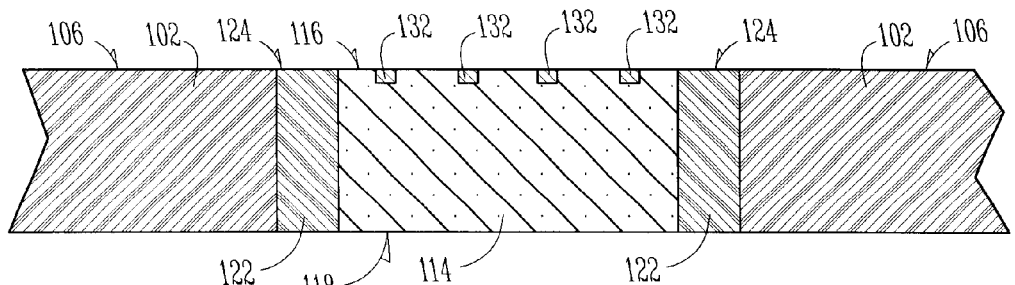
FIGS. 9–17 are side cross-sectional views of a process of forming build-up layers on a microelectronic die, encapsulation material, and a microelectronic package core, according to the present invention.

FIG. 9 illustrates a view of a single microelectronic die 114 encapsulated with encapsulation material 122 within the microelectronic package core 102. The microelectronic die 114, of course, includes a plurality of electrical contacts 132 located on the microelectronic die active surface 116. The electrical contacts 132 are electrically connected to circuitry (not shown) within the microelectronic die 114. Only four electrical contacts 132 are shown for sake of simplicity and clarity.

Figure 10:
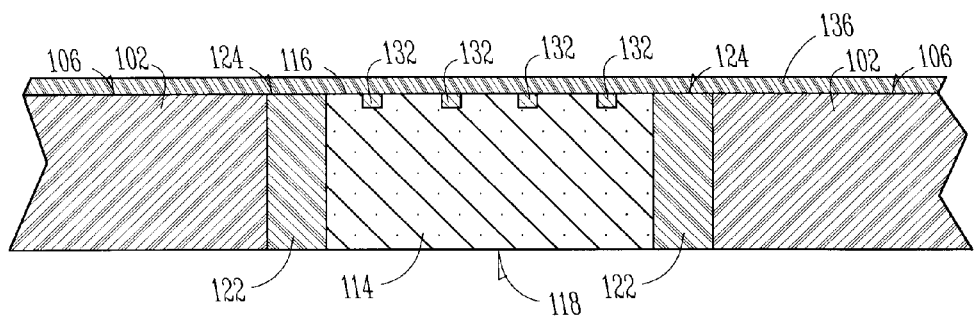

As shown in FIG. 10, a first dielectric layer 136, such as epoxy resin, polyimide, bisbenzocyclobutene, and the like, is disposed over the microelectronic die active surface 116 (including the electrical contacts 132), the microelectronic package core first surface 106, and the encapsulant material surface 124. The dielectric layers of the present invention are preferably filled epoxy resins available from Ibiden U.S.A. Corp., Santa Clara, Calif., U.S.A. and from Ajinomoto U.S.A., Inc., Paramus, N.J., U.S.A. The formation of the first dielectric layer 136 may be achieved by any known process, including but not limited to lamination, spin coating, roll coating, and spray-on deposition.

Figure 11:
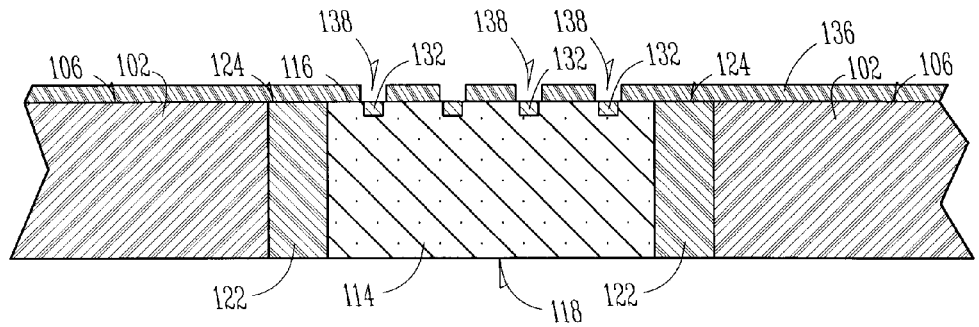

As shown in FIG. 11, a plurality of vias 138 are then formed through the first dielectric layer 136. The plurality of vias 138 may be formed by any method known in the art, including but not limited to laser drilling, photolithography, and, if the first dielectric layer 136 is photoactive, forming the plurality of vias 138 in the same manner that a photoresist mask is made in a photolithographic process, as known in the art.

Figure 12:
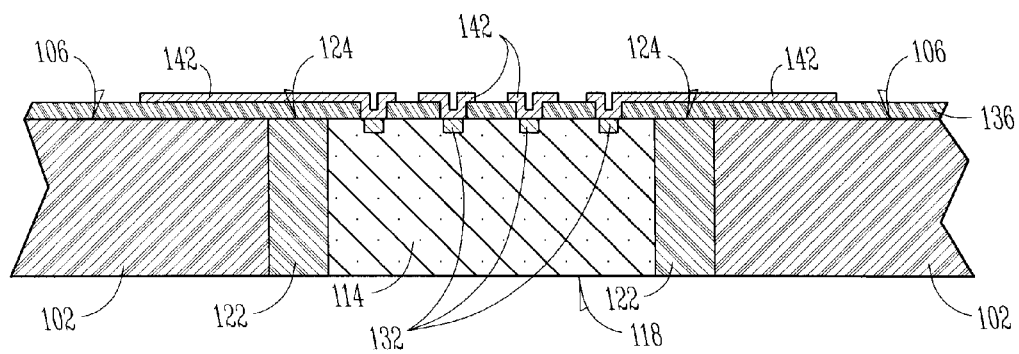

A plurality of conductive traces 142 is formed on the first dielectric layer 136, as shown in FIG. 12, wherein a portion of each of the plurality of conductive traces 142 extends into at least one of said plurality of vias 138 (see FIG. 11) to make electrical contact with the contacts 108. The plurality of conductive traces 142 may be made of any applicable conductive material, such as copper, aluminum, and alloys thereof.

The plurality of conductive traces 142 may be formed by any known technique, including but not limited to semi-additive plating and photolithographic techniques. An exemplary semi-additive plating technique can involve depositing a seed layer, such as a sputter-deposited or electroless-deposited metal on the first dielectric layer 136. A resist layer is then patterned on the seed layer, such as a titanium/copper alloy, followed by electrolytic plating of a layer of metal, such a copper, on the seed layer exposed by open areas in the patterned resist layer. The patterned resist layer is stripped and portions of the seed layer not having the layer of metal plated thereon is etched away. Other methods of forming the plurality of conductive traces 142 will be apparent to those skilled in the art.

Figure 13:
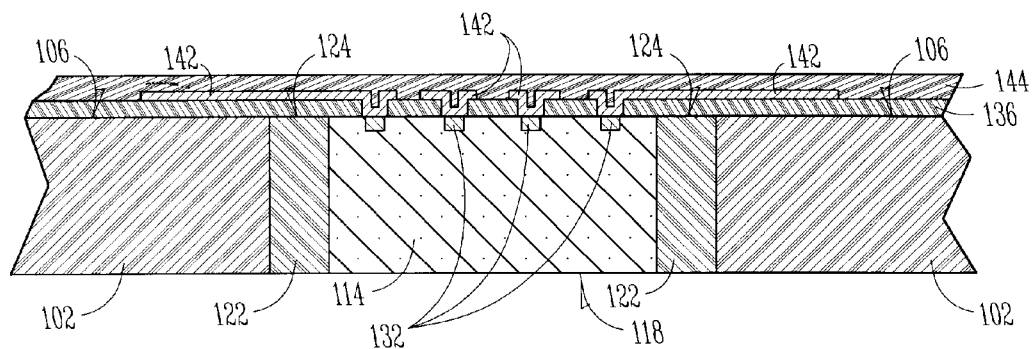

As shown in FIG. 13, a second dielectric layer 144 is disposed over the plurality of conductive traces 142 and the first dielectric layer 136. The formation of the second dielectric layer 144 may be achieved by any known process, including but not limited to film lamination, spin coating, roll coating, and spray-on deposition.

Figure 14:
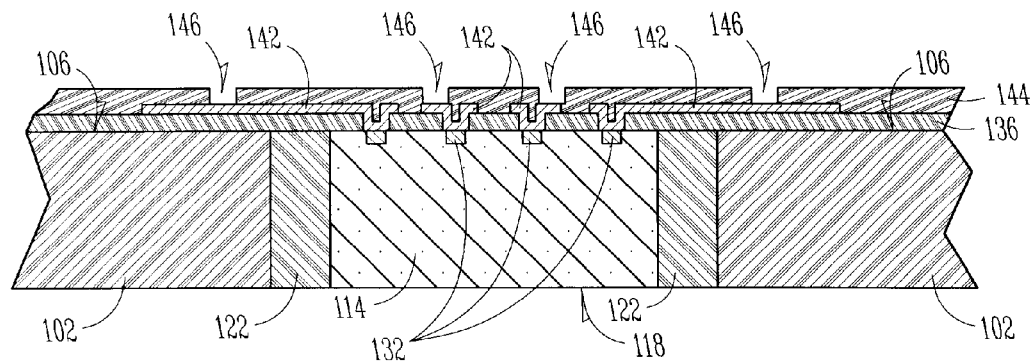

As shown in FIG. 14, a plurality of second vias 146 are then formed through the second dielectric layer 144. The plurality of second vias 146 may be formed any method known in the art, including but not limited to laser drilling and, if the second dielectric layer 144 is photoactive, forming the plurality of second vias 146 in the same manner that a photoresist mask is made in a photolithographic process, as known in the art.

If the plurality of conductive traces 142 is not capable of placing the plurality of second vias 146 in an appropriate position, then other portions of the conductive traces are formed in the plurality of second vias 146 and on the second dielectric layer 144, another dielectric layer formed thereon, and another plurality of vias is formed in the dielectric layer, such as described in FIGS. 12–14. The layering of dielectric layers and the formation of conductive traces can be repeated until the vias are in an appropriate position. Thus, portions of a single conductive trace be formed from multiple portions thereof and can reside on different dielectric layers.

Figure 15:
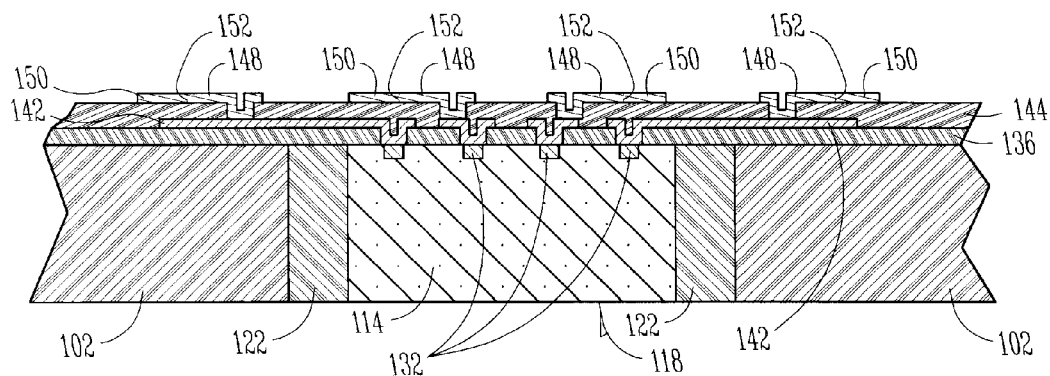

A second plurality of conductive traces 148 may be formed, wherein a portion of each of the second plurality of conductive traces 148 extends into at least one of said plurality of second vias 146. The second plurality of conductive traces 148 each include a landing pad 150 (an enlarged area on the traces demarcated by a dashed line 152), as shown in FIG. 15.

Figure 16:
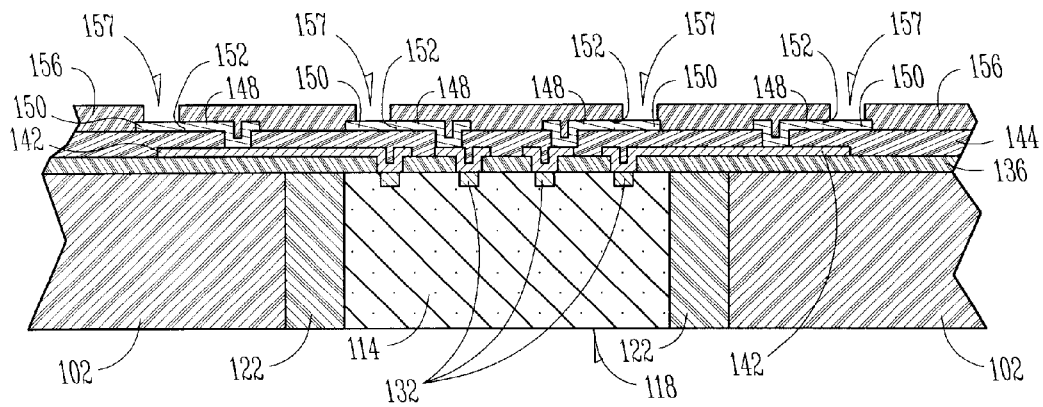
Figure 17:
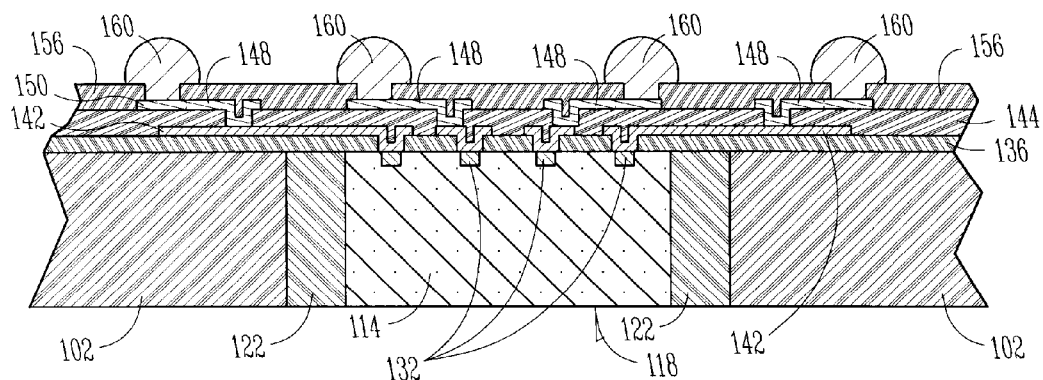

Once the second plurality of conductive traces 148 and landing pads 150 are formed, they can be used in the formation of conductive interconnects, such as solder bumps, solder balls, pins, and the like, for communication with external components (not shown). For example, a solder mask material 156 can be disposed over the second dielectric layer 144 and the second plurality of conductive traces 148 and landing pads 150. A plurality of vias 157 is then formed in the solder mask material 156 to expose at least a portion of each of the landing pads 150, as shown in FIG. 16. A plurality of conductive bumps 160, such as solder bumps, can be formed, such as by, but not limited to, screen printing solder paste followed by a reflow process or by known plating techniques, on the exposed portion of each of the landing pads 150, as shown in FIG. 17.

Figure 18:
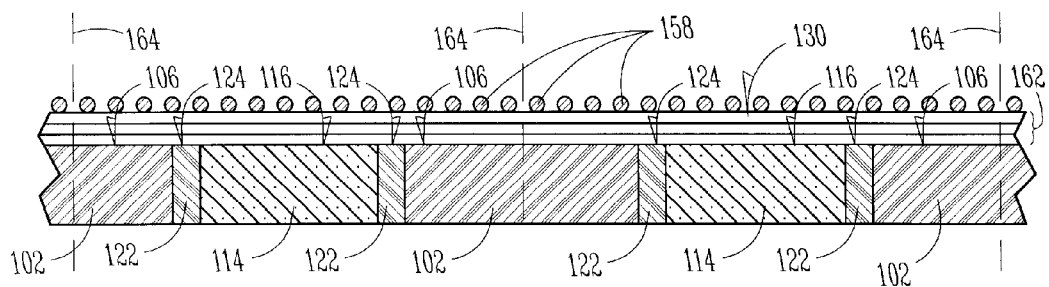
FIG. 18 is a side cross-sectional view of the assembly of FIG. 7 having build-up layers and solder balls positioned thereon, according to the present invention.
Figure 19:
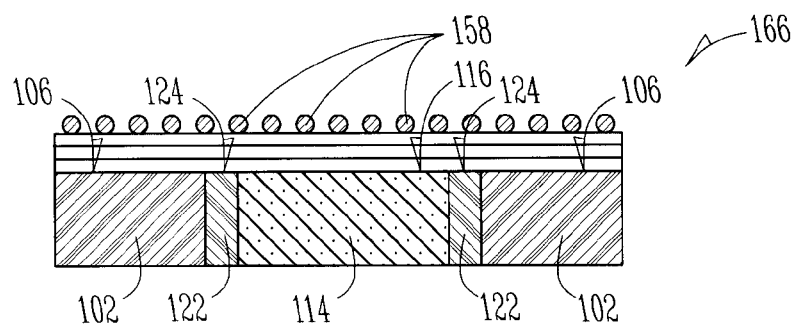
FIG. 19 is a side cross-sectional view of a singulated device, according to the present invention.
Figure 20:
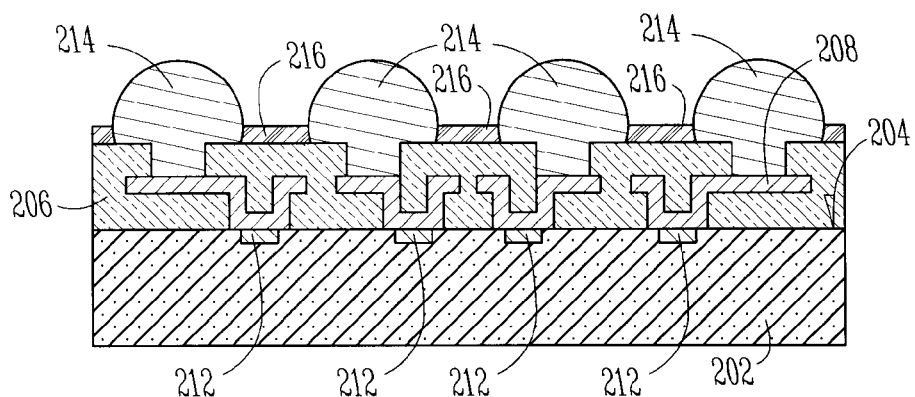
FIG. 20 is a cross-sectional view of a true CSP of a microelectronic device, as known in the art.
Figure 21:
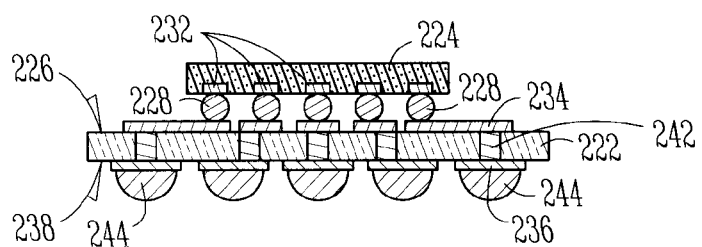
FIG. 21 is a cross-sectional view of a CSP of a microelectronic device utilizing a substrate interposer, as known in the art.

FIG. 18 illustrates a plurality of microelectronic dice 114 encapsulated with encapsulation material 122 within the microelectronic package core 102. At least one build-up layer is formed on the microelectronic dice active surfaces 116, the microelectronic package core first surface 106, and the encapsulant material surface 124 in the manner previously discussed. The layer(s) of dielectric material and conductive traces comprising the build-up layer is simply designated together as buildup layer 162 in FIG. 18. The individual microelectronic dice 114 are then singulated along lines 164 (cut) through the build-up layer 162 and the microelectronic package core 102 to form at least one singulated microelectronic die package 166, as shown in FIG. 19.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic package core having a first surface and an opposing second surface, said microelectronic package core having at least one opening defined therein extending from said microelectronic package core first surface to said microelectronic package core second surface;
   at least one microelectronic die disposed within said at least one opening, said at least one microelectronic die having an active surface; and
   an encapsulation material adhering said microelectronic package core to said at least one microelectronic die, wherein said encapsulation material further includes at least one surface substantially planar to said microelectronic die active surface and said microelectronic package core first surface.

2. The microelectronic package of claim 1, further including build-up layers disposed on at least one of said microelectronic die active surface, said at least one encapsulation material surface, and said microelectronic package core first surface.

3. The microelectronic package of claim 2, wherein said build-up layers comprise at least one dielectric layer abutting at least one of said microelectronic die active surface, said at least one encapsulation material surface, and said microelectronic package core first surface and at least one conductive trace disposed on said at least one dielectric layer.

4. The microelectronic package of claim 3, wherein said at least one conductive trace extends through said at least one dielectric layer to contact at least one electrical contact on said microelectronic die active surface.

5. The microelectronic package of claim 2, wherein at least one build-up layer on said at least one of said microelectronic die active surface, said at least one encapsulation material surface, and said microelectronic package core first surface.

6. The microelectronic package of claim 2, wherein the build-up layers include a first dielectric layer; and a first plurality of conductive traces on the first dielectric layer.

7. The microelectronic package of claim 2, wherein the build-up layers include a first dielectric layer; a first plurality of conductive traces on the first dielectric layer; a second dielectric layer; and a second plurality of conductive traces on the second dielectric layer.

8. The microelectronic package of claim 2, wherein the build-up layers include a first dielectric layer; a first plurality of vias disposed in the first dielectric layer; and a first plurality of conductive traces on the first dielectric layer, wherein a portion of at least one of the first plurality of conductive traces extends into at least one of the first plurality of vias.

9. The microelectronic package of claim 2, wherein the build-up layers include a first dielectric layer; a first plurality of vias disposed in the first dielectric layer; a first plurality of conductive traces on the first dielectric layer; a second dielectric layer; a second plurality of vias disposed in the second dielectric layer; a second plurality of conductive traces on the second dielectric layer; wherein a portion of at least one of the first plurality of conductive traces extends into at least one of the first plurality of vias, and wherein a portion of at least one of the second plurality of conductive traces extends into at least one of the second plurality of vias.

10. The microelectronic package of claim 1, wherein the thickness of said microelectronic die is greater than a thickness of said microelectronic package core.

11. The microelectronic package of claim 10, wherein said microelectronic package core includes at least one via extending therethrough.

12. The microelectronic package of claim 1, wherein said microelectronic package core is selected from the group consisting of bismaleimide triazine resin based material, an FR4 material, polyimides, ceramics, and metals.

13. The microelectronic package of claim 1, wherein the thickness of said microelectronic die is greater than a thickness of said microelectronic package core, and wherein the encapsulation material covers the microelectronic package core second surface.

14. The microelectronic package of claim 1, wherein the thickness of said microelectronic die is greater than a thickness of said microelectronic package core, and wherein the microelectronic package core includes a plurality of vias extending therethrough.

15. The microelectronic package of claim 1, wherein the thickness of said microelectronic die is greater than a thickness of said microelectronic package core, and wherein the microelectronic package core includes a plurality undercuts in said microelectronic package core thickness.

16. A microelectronic package, comprising:

a microelectronic package core having a first surface and an opposing second surface, said microelectronic package core having at least one opening defined therein extending from said microelectronic package core first surface to said microelectronic package core second surface;

at least one microelectronic die disposed within said at least one opening, said at least one microelectronic die having an active surface, wherein the thickness of said microelectronic die is greater than a thickness of said microelectronic package core;

an encapsulation material adhering said microelectronic package core to said at least one microelectronic die, wherein said encapsulation material further includes at least one surface substantially planar to said microelectronic die active surface and said microelectronic package core first surface; and build-up layers disposed on at least one of said microelectronic die active surface, said at least one encapsulation material surface, and said microelectronic package core first surface.

17. The microelectronic package of claim 16, wherein the encapsulation material covers the microelectronic package core second surface.

18. The microelectronic package of claim 16, wherein the microelectronic package core includes a plurality vias extending therethrough.

19. The microelectronic package of claim 16, wherein the microelectronic package core includes a plurality of undercuts in said microelectronic package core thickness.

* * * * *